United States Patent [19]

Chia et al.

[11] Patent Number: 5,197,183
[45] Date of Patent: Mar. 30, 1993

[54] MODIFIED LEAD FRAME FOR REDUCING WIRE WASH IN TRANSFER MOLDING OF IC PACKAGES

[75] Inventors: Chok J. Chia, Campbell; Seng-Sooi Lim, San Jose, both of Calif.

[73] Assignee: LSI Logic Corporation, Milpitas, Calif.

[21] Appl. No.: 787,848

[22] Filed: Nov. 5, 1991

[51] Int. Cl.[5] ............... B29C 45/02; B29C 53/02
[52] U.S. Cl. ............... 29/827; 264/272.17; 264/328.12
[58] Field of Search ........ 264/273.15, 272.17, 264/275, 294, 296, 328.12, 339; 425/129.1, 544, 293; 29/855, 856, 841, 884, 874, 827, 832

[56] References Cited

U.S. PATENT DOCUMENTS

| 4,043,027 | 8/1977 | Birchler et al. | 29/588 |
|---|---|---|---|
| 4,556,896 | 12/1985 | Meddles | 357/70 |
| 4,788,583 | 11/1988 | Kawahara et al. | 357/72 |
| 4,894,704 | 1/1990 | Endo | 357/70 |
| 4,987,473 | 1/1991 | Johnson | 357/70 |
| 4,994,895 | 2/1991 | Matsuzaki et al. | 357/72 |
| 5,018,003 | 5/1991 | Yasunaga et al. | 357/72 |

FOREIGN PATENT DOCUMENTS

| 52-43366 | 1/1975 | Japan | 264/272.17 |
|---|---|---|---|
| 55-120153 | 9/1980 | Japan | 264/272.17 |
| 59-81125 | 5/1984 | Japan | 264/272.17 |
| 61-4234 | 1/1986 | Japan | 264/272.17 |
| 61-5529 | 1/1986 | Japan | 437/211 |

OTHER PUBLICATIONS

Microelectronics Packaging Handbook, Tummala and Rymaszewski, 1989 Van Nostrand Reinhold pp. 578-591.

Primary Examiner—Jan H. Silbaugh
Assistant Examiner—Ay Ortiz
Attorney, Agent, or Firm—Gerald E. Linden; Michael D. Rostoker

[57] ABSTRACT

In a leadframe supporting a semiconductor device, the tiebar adjacent the mold gate is kinked, or cut and bent, to form a baffle shielding bond wires connecting the semiconductor device to the leadframe from damage by a jet of incoming molding compound. Whether kinked or cut/bent, the baffle extends out of the plane of the leadframe so as to be disposed more-or-less directly in front of the gate.

6 Claims, 5 Drawing Sheets

MODIFIED LEAD FRAME FOR REDUCING WIRE WASH IN TRANSFER MOLDING OF IC PACKAGES

TECHNICAL FIELD OF THE INVENTION

The invention relates to the packaging of integrated circuit (IC) semiconductor devices, and more particularly to injection transfer molding.

BACKGROUND OF THE INVENTION

Present plastic packaging techniques involve molding a plastic package "body" around a semiconductor die. Prior to molding, the die is attached to a lead frame, or the like, having a plurality of leads. The leads have inner portions within the package body, and outer portions exiting the package body for connecting to external circuits, such as by conductors on a printed circuit board. Various forms of plastic packaged ICs are known, including DIP (Dual In-line Package), PQFP (Plastic Quad Flat Pack) and PLCC (Plastic Leaded Chip Carrier).

*Microelectronics Packaging Handbook,* edited by Tummala and Rymaszewski, published 1988 by Van Nostrand Reinhold, discloses transfer molding at pages 578-591. Generally, as described therein, transfer molding has been and still is the standard workhorse of the electronic packaging industry. It is an automated version of compression molding in which a preform of plastic compound is forced from a pot into a hot mold cavity. The molds are steel, and have top and bottom "halves". Each mold half has a cavity defining the size, shape and surface finish of a plastic IC package. "Gates" are small openings into the cavities where the molding compound is injected. "Vents" are other small openings allowing air to escape the cavity when molding compound is injected.

The molding compound is typically a polymer that is a solid at room temperature. It is melted prior to transfer to the cavity. The viscosity of the melted compound is generally relatively high, and the transfer occurs at elevated temperatures and pressures—typically at 900 psi (pounds per square inch) and 175 degrees centigrade.

One problem in the molding process is minimizing "wire sweep". Wire sweep refers to the displacement and/or distortion of wires attaching the semiconductor die to the lead frame (or the like) as the molding compound is injected into the cavity. As noted in *Microelectronics Packaging Handbook,* gates are usually placed in the bottom mold half, so that the "jet" of molding compound is directed away from the bond wires.

Another approach to minimizing wire sweep is to provide gates in both the top and bottom mold halves, as disclosed for example in copending, commonly-owned U.S. Patent Application No. 619,107, filed 11/27/90 by Schneider and Fehr.

FIGS. 1A and 1B show a typical plastic-packaged semiconductor device 100 of the prior art. A semiconductor die 102 is connected, such as by a number of bond wires 104, to inner ends of a corresponding number of leads 106. Other techniques for connecting the die to the inner ends of the leads are known. A plastic body 108 is formed about the die 102 and the inner ends of the leads, by any of a number of known molding processes. The exposed outer portions of the leads 106, exterior the body 108, are bent downwardly (indicated by the dashed line "C") and outwardly (indicated by the dashed line "D") to form what is commonly termed a "gull wing" configuration. Each lead 106 has a width (w) on the order of eight thousandths of an inch (0.2 mm), and the spacing (s) between adjacent leads 106 is typically on the order of twenty thousandths of an inch (0.5 mm).

The wires used to interconnect the die to the leadframe are typically made of pure gold having a diameter on the order of 0.0013 inch. The length of the bond wires can extend in length up to about 0.160 inch. In each device, these bond wires may be spaced apart at separations of only 0.005 inch.

FIG. 1B shows a lead form (or frame) 120 having a plurality of leads 106. The lead frame is formed from a conductive foil having a thickness (t) on the order of a few thousandths of an inch (e.g. 0.004–0.006 inch). The material for the leads 106 is typically copper, or "Alloy 42". As shown, the leads 106 terminate in an outer square ring portion 122 of the lead frame 120, from which the completed (packaged) device is ultimately excised, as indicated by the dashed line "A". Of particular note in FIG. 1B are "dambars" 124 bridging adjacent leads 106 at a position indicated by the dashed line "B" (closely adjacent or immediately exterior to the body 108. The dambars 124 are formed from the conductive material forming the leads 106, and hence are of the same thickness as the leads 106. These dambars 124 aid in maintaining alignment between the inner ends of the leads, although a die attach pad (not shown) formed from the foil is typically employed and will serve the same purpose. More importantly, however, the dambars 124 are critical in the molding process, discussed hereinbelow. (Since the leads 106 create a gap between the clamshell halves of the mold, the dambars 124 prevent plastic from "flashing" between the leads 106 exterior the body 108. After the die is packaged in the plastic body, the dambars 124 are excised, and any residual plastic flash between the outer portions of leads 106 is cleaned out in a "dejunking" step.)

FIG. 1C shows, generally, a tape-mounted semiconductor device assembly 10, as described in copending, commonly-owned U.S. Patent Application No. 454,752, entitled HEAT SINK FOR SEMICONDUCTOR DEVICE ASSEMBLY, filed Dec. 19, 1989 by Long, Schneider and Patil. The semiconductor device assembly 10 includes an upper, segmented plastic film layer 14, formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18. In lieu of employing bond wires 24, conductive bumps may be employed to provide a conductive path from the device 22 to the leads 18 in a tape automated bonding (TAB) process.

The upper plastic layer 14 does not form a continuous surface, but rather is segmented to include an inner ring portion 14A, one or more intermediate ring portions 14B and 14C disposed outside of the inner ring portion, and an exterior ring portion 14D disposed outside of the intermediate ring portions. The upper plastic layer 14 is formed of a plastic tape, such as KAPTON, and forms a thin, insulating supportive structure for the leads 18. The inside periphery of the inner ring portion 14A supports the outside periphery of the die attach pad 20, and the outside periphery of the inner ring portion 14A supports the innermost ends of the leads 18, in essence forming a "bridge" between the die attach pad and the leads. A layer-like quantity of silicone gel 28, such as Dow Corning Q1-4939, having a 1 to 10 mixing ratio of curing agent to base, encapsulates the leads 24. A body 30, formed of molding compound (described hereinafter), is formed around the device 22, leaving outer portions of the leads 18 exposed, exterior the body. The silicone gel 28 acts as a moisture barrier and a stress relief for the leads 24 during body molding, as well as prevents molding compound from contacting the semiconductor die. Surface tension between the silicone gel and the leads 24 keeps the silicone gel in place around the leads during assembly of the semiconductor device assembly. The lower plastic layer 16 covers the bottom of the die attach pad 20, and extends generally over the entire area described by the intermediate ring portion 14C, on the opposite side of the leads 18 and die attach pad 20. The lower plastic layer 16 is formed of a plastic tape material, such as KAPTON.

A "surrogate" lead frame (edge ring) 12 is provided for handling the semiconductor device assembly during manufacture thereof, and shorts the outer ends of the leads 18 to facilitate electroplating. After molding the body about the device, the semiconductor device assembly is excised from the lead frame 12 and exterior ring portion 14D, neither of which properly form any part of the ultimate semiconductor device assembly 10.

FIGS. 2A, 2B and 2C show transfer molding apparatus of the prior art. Transfer molding is an automated version of compression molding in which hot, liquid molding compound is forced from a reservoir, or pot, into mold cavities.

Molding compounds are typically resins, such as advanced B-stage compounds. In general purpose applications, wood-flour-filled phenolics, for instance, are fairly popular due to their excellent moldability and low cost. As powders and granules, they are also easily shaped into pellets by automatic preformers. The main drawback with phenolics is their limited colorability. When coloring is a major design factor, melamine, polyester, or urea are usually selected because there is a wider selection of shades and colors. For electronic packaging, the preferred resin is epoxy.

The mold set 200 has two halves, a top half 202 and a bottom half 204, each of which is provided with a recess 206 and 208, respectively. The recesses face each other when the mold is closed, forming a cavity 210 defining the size, shape and surface finish of a molded body (e.g., 108 of FIG. 1A). As shown in FIG. 2C, the mold halves close around the lead frame (e.g., 122 of FIG. 1B; or surrogate lead frame 12 of FIG. 1C), that close about open to receive lead frames and are closed (as shown), so that the semiconductor device (e.g., 102 of FIG. 1B) is contained within the cavity 210.

The bottom half 204 of the mold set is typically provided with a primary "runner" 212 receiving molten molding compound from a pot 214. One or more secondary runners 214 extend from the primary runner 212 to the cavity 210, in the bottom half 204 of the mold set. At the interface between the secondary runner 214 and the cavity 208 is a "gate" 216. "Gates" are small openings into the cavity 210 where the liquid molding compound is injected, and are normally found only in the bottom mold half ("chase") under the plane of the chip and the wires to minimize wire sweep. Typical gate dimensions are 60-100 mils wide (at the cavity interface) by 20-30 mils deep (from the secondary runner to the cavity). Air vent slots (not shown) are located opposite each gate to prevent partial fill and voids in the finished part.

In the case of a molding press provided with multiple mold sets (hence, multiple cavities), the layout of the runner system is balanced to provide for an even distribution of molding compound to each cavity. The object is to fill each cavity with compound of uniform density so that parts located next to a pressurized input (not shown) will have identical properties to those located at the other locations along the primary runner.

It has been noted that the flow of molten compound (plastic) into the bottom mold half causes not only wire sweep, but also can cause distortion of the die attach pad (e.g., 20, FIG. 1C). Large die attach pads are forced upward in the process, destroying wire bonds or disorienting the die. The result is often reject parts, which represent waste and decreased throughput. Further, as lead count increases (lead pitch gets finer) each lead becomes increasingly more delicate, exacerbating the aforementioned problems.

These problems are particularly evident when the semiconductor device (die) is mounted to a tape, in what is termed a "tape automated bonding" (TAB) process (See e.g., FIG. 1C). Because the supporting TAB structure (e.g., 14, 16, 18, FIG. 1C) is flimsier than lead frame counterparts (e.g., 122, FIG. 1B), extra care in handling during the molding process is required. Proposed solutions include positioning delicate metal inserts (not shown) within the mold to aid in supporting the tape, or modifying the mold (not shown) to clamp down on only a predetermined portion of the tape. In the former, an additional time lag is introduced into the molding cycle. In the latter, accurate tape indexing and operator monitoring would be required. Another option is to use a stronger tape, such as TapePac (trademark of National Semiconductor). However, the TapePac tape has a relatively low number of leads, and presents a restrictive sourcing requirement.

U.S. Pat. No. 4,987,473 discloses a leadframe (50) wherein one series of lead tips (50a, 50c, 50e..) are bent upwards, and another series of lead tips (50b, 50d, 50f..) are bent downwards to form a leadframe with multi-tier leads, for the purpose of allowing denser packaging. This patent is cited as an example of lead frames.

U.S. Pat. No. 4,994,895 discloses a hybrid integrated circuit package. By way of example, a circuit substrate (2) is mounted to a lead frame (9) having upwardly deformed inner leads (31) and lowered stages (100), and is directed to relieving stress on the substrate.

U.S. Pat. No. 4,556,896 discloses a lead frame structure. IN FIG. 12, for example, we see two mold halves (60 and 70), and an opening (50) formed in a portion (30) of the lead frame straddling the lateral edge of the cavity (61). In other words, part of the lead frame structure is modified to act as a gate.

U.S. Pat. No. 4,788,583 discloses a semiconductor element (1) mounted on a stage (2; also known as "die attach pad"), and stage bars (3 and 4; also known as "tie bars") extending from both sides of the stage for supporting the stage during the production process. In FIG. 2A therein, the stage bars (15 and 16) are shortened, and end inside the resin package (17). A two step molding process is disclosed. As shown in FIG. 5 therein, after a first, inner package molding process, portions of the stage bars (26 and 27) in the vicinity of the frames (28 and 29) are cut off. Thereafter, an outer resin package portion (19) is formed.

U.S. Pat. No. 5,018,003 discloses a lead frame (8), wherein an outer frame portion (2) is disposed in a gate portion of mold halves for the purpose of splitting the mold compound flow evenly into the top and bottom portions of the mold. Evidently mold design would be affected by whether or not the disclosed lead frame were to be used.

U.S. Pat. No. 4,043,027 discloses a process for encapsulating electronic components, showing bottom gating.

U.S. Pat. No. 4,894,704 discloses a lead frame for resin molding. A projection or extended portion (16) is formed at the edge of the inner lead part (15) nearest to a gate part (13). A resin flow passes through the mold and collides with the projection near an inlet of the cavity. The air at corners near the cavity inlet is purged away and, consequently, pressure transfer efficiency at the corners is enhanced. Notably, the projections (16) are coplanar with the lead frame.

While the patents cited above show various modifications to a lead frame, they neither disclose nor suggest the lead frame structure of the present invention.

DISCLOSURE OF THE INVENTION

It is therefore an object of the present invention to provide a technique for molding IC packages that alleviates the problems of wire sweep and die attach pad distortion.

It is a further object of the present invention to provide a process for molding IC packages that decreases waste and increases throughput.

It is further object of the present invention to provide a molding technique for molding package bodies about tape mounted (TAB) devices, which avoids the use of metal inserts, modified mold clamping configurations, or the use of a particular mold design.

It is a further object of the present invention to provide a mold set for molding plastic IC packages without exerting unbalanced forces on the die attach pad and/or die.

It is further object of the present invention to provide a plastic IC package formed by the disclosed techniques.

According to the invention, a plastic-packaged semiconductor device has a die mounted to a substrate, such as a lead frame or a tape carrier. The substrate has a plurality of leads, and the die is connected, such as by bond wires, to the leads. Preferably, the die is mounted to a die attach pad (paddle).

The die attach pad is supported by tie bars to an outer ring of the lead frame.

In one embodiment of the invention, one of the four corner tie bars, namely the tie bar adjacent a gate, is bent (kinked) upward, to deflect molding compound upward in the mold cavity, thereby alleviating wire wash. (The bond wires are atop the die).

In another embodiment, the tiebar is cut (rather than kinked), and the remaining "stub" is bent upward to act as the deflector.

In both embodiments, the tiebar is modified to be out-of-plane with the remaining elements of the lead frame, and the modifications are preferably performed as closely to the ultimate mold gate location as possible, without impairing the volume of compound flow through the gate. By extending upward, in front of the gate, the tiebar modification acts as a baffle to deflect a jet of incoming molding compound from directly impacting the bond wires.

A molded plastic body is formed about the die, and inner portions of the leads. Outer portions of the leads exit the body, for connecting the completed device to other circuits.

The body is molded in a press, by placing the mounted and connected die within a cavity created by recesses in two mold halves. One or both of the mold halves are provided with a "runner" receiving liquid molding compound from a reservoir, and at least one "gate" leading from the runner to the cavity.

A completed, packaged semiconductor device with increased reliability is thereby created.

The invention provides a technique for dispersing the force of the stream of molten molding compound plastic from directly impinging onto bond wires during the transfer molding process, without modifications to existing molds.

The modified tiebar of the present invention prevents molding compound from moving bond wires connecting semiconductor dies to leadframes. Modifications such as those shown are low cost, and have no adverse impact on device reliability. Furthermore, longer bond wires can be used, which affords a degree of design flexibility hitherto unknown.

Top gating (versus bottom gating) affords certain advantages, but results in certain disadvantages. Without the tiebar modification of the present invention, a top-gated mold would result in the top section being filled at a faster rate than the bottom section. Also, the molding compound would flow directly onto the wires, causing sagging and bending. The resulting loss of yield due to these problems would be significant. By modifying the tiebar as shown herein, the cavity can be filled through the top gate without damage to the wires, by ensuring a balanced fill rate between the top and bottom sections of the package. This will improve yield.

Other objects, features and advantages of the invention will become apparent in light of the following description thereof.

DETAILED DESCRIPTION OF THE INVENTION

Figure 1A:
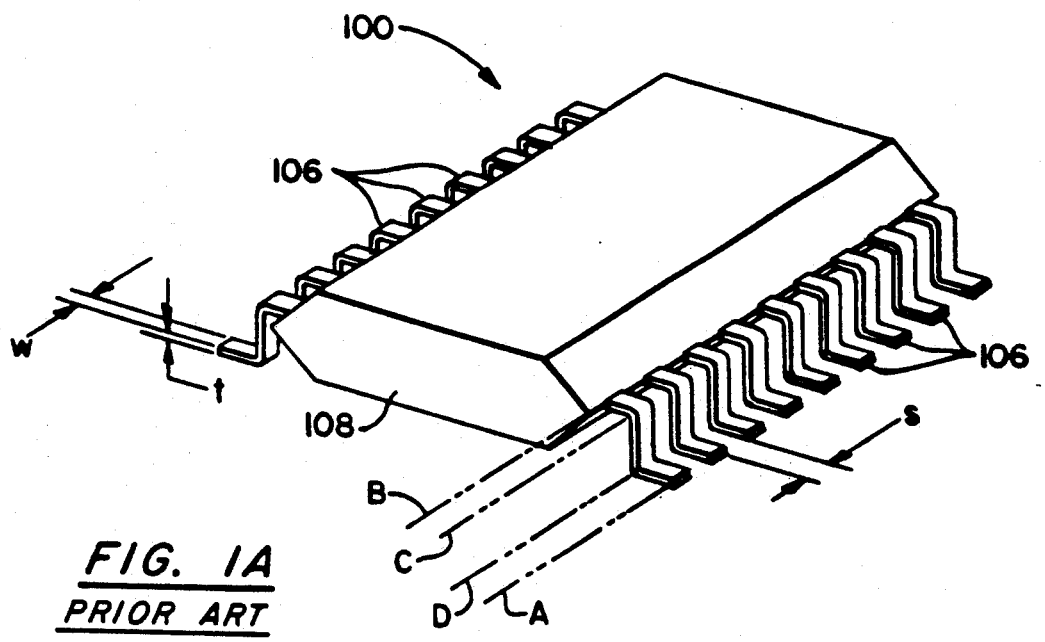
FIG. 1A is a perspective view of a completely formed plastic-packaged semiconductor device of the prior art.
Figure 1B:
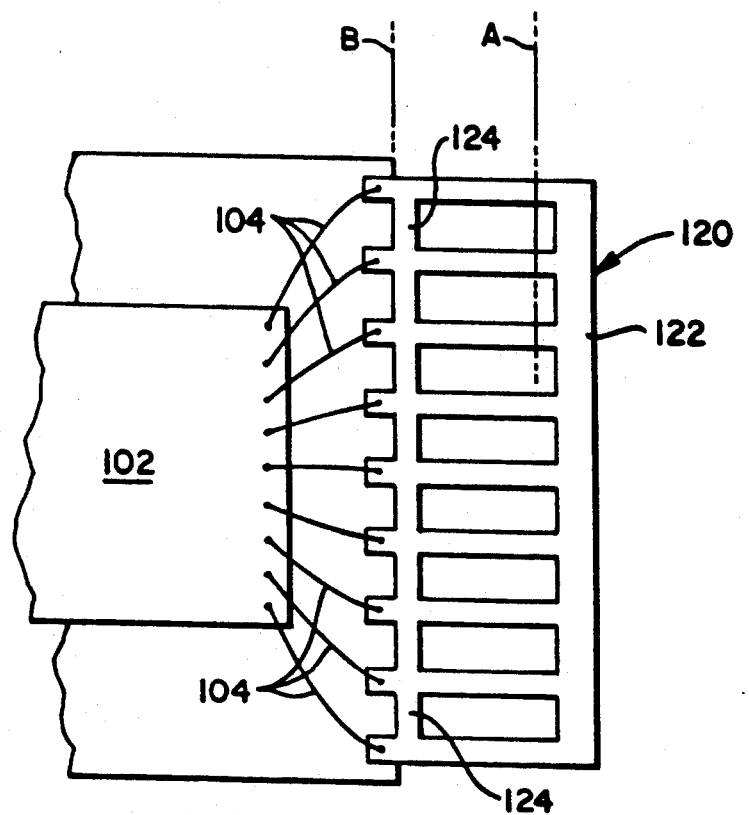
FIG. 1B is a plan view, partially cutaway, of the semiconductor device of FIG. 1A, at an intermediate step in the manufacture thereof, showing a lead frame.

FIGS. 1A and 1B illustrate a plastic-packaged semiconductor device 100 of the prior art, and are discussed hereinabove. The techniques for creating such packages are well known, including techniques for mounting a die to a lead frame, molding a plastic body about the die and inner portions of leads, excising the lead frame, and "dejunking" (removing) superfluous plastic "flash" from between the leads.

Figure 1C:
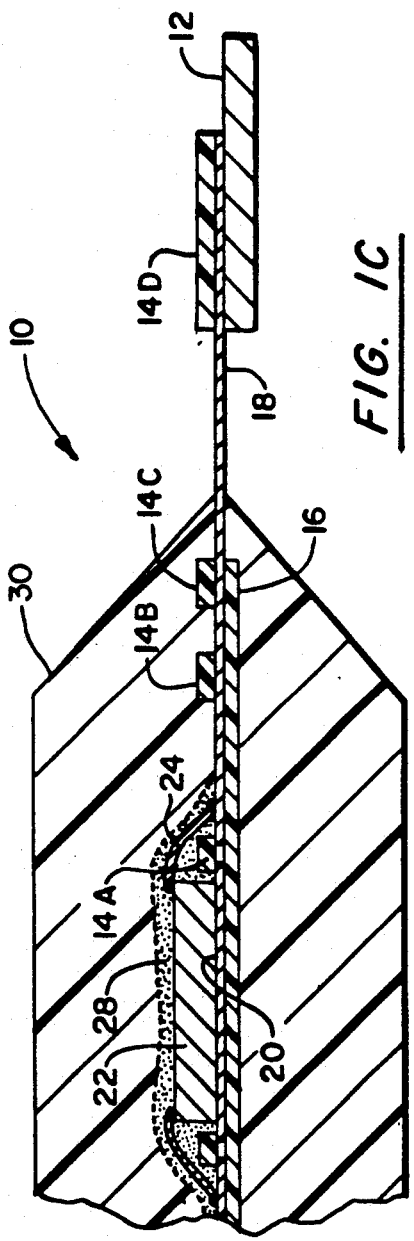
FIG. 1C is a partial cross-sectional view of a tape-mounted semiconductor device, similar in various respects to the devices shown in FIGS. 1A and 1B.

FIG. 1C illustrates a packaging technique for tape mounted semiconductor devices, and is discussed above.

Figure 2C:
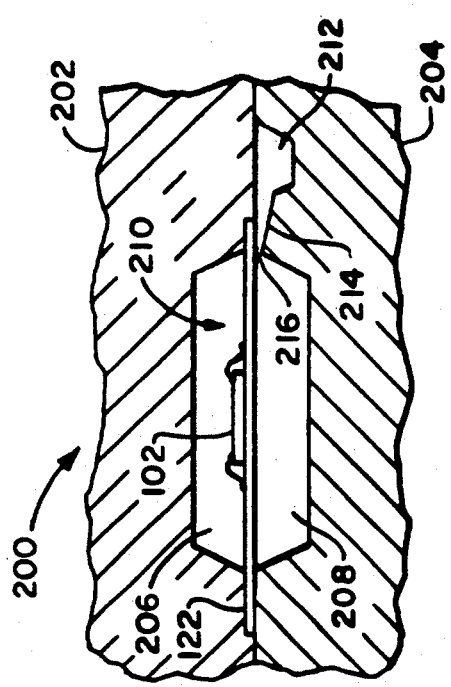
FIG. 2C is a cross-sectional view of a prior art mold set, with semiconductor device contained within its cavity, for the transfer mold press of FIG. 2A, taken on a line B—B through FIG. 2A.
Figure 2B:
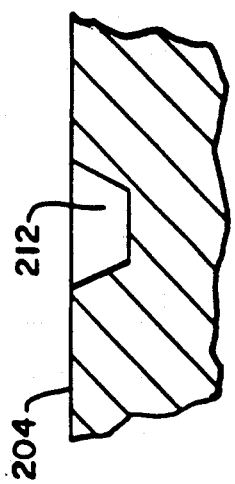
FIG. 2B is a cross-sectional detail view of a portion of a prior art bottom mold for the transfer mold press of FIG. 2A, taken on a line A—A through FIG. 2A.
Figure 2A:
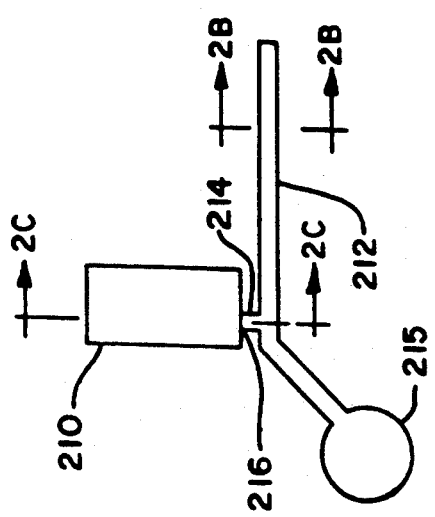
FIG. 2A is schematic diagram of a transfer mold press of the prior art.

FIGS. 2A, 2B and 2C illustrate the transfer molding process for forming bodies around semiconductor devices with a mold set, and are discussed above.

Figure 3:
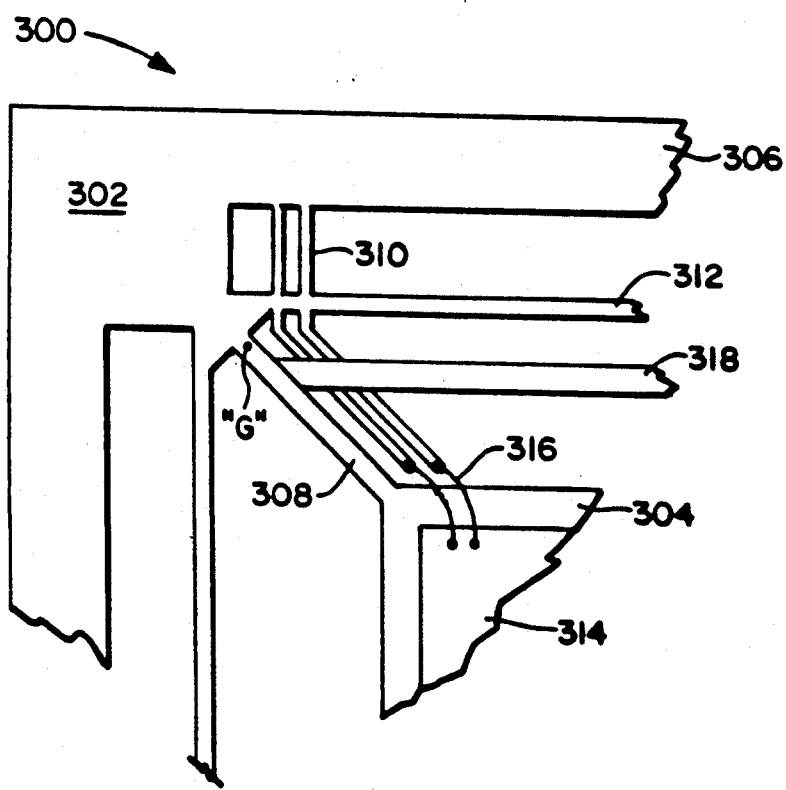
FIG. 3 is a partial plan view of a corner of an unmodified lead frame.

FIG. 3 shows a standard leadframe 300, a major component of which is a patterned, planar metal layer (foil) 302. The layer 302 includes a square die paddle (or die attach pad) 304, an outer generally square ring 306, a tie bar 308 extending from a corner of the paddle 304 to the outer ring 306, and a plurality of conductive leads 310 (only a few of many shown, for clarity) extending from adjacent the paddle 304 to a support ring 312 interior the outer ring 306. A semiconductor die 314 is mounted to the paddle, and bond wires 316 connect circuit elements on the top surface of the die to the inner ends of the leads 310. For additional support of the delicate leads 310, a square plastic film layer ring 318 may be disposed inward of the support ring 312. Additionally, the underside of the lead frame may be provided with another plastic film layer, for additional support of the leads.

Ultimately, the leadframe with the die mounted and the bond wires attached is placed between the two halves of a mold cavity, so as to be suspended in the cavity, and molding compound is injected through a gate into the cavity.

Typically, a single gate is located at a single corner of the cavity, and vents (not shown) are located at the other three corners. In FIG. 3, the location of the gate is indicated by the label "G", along the tiebar 308 and just inside of the support ring 312 and outside of the plastic ring 318. (The support ring will be excised after molding, since it shorts the leads together.) Gates are necessarily small, on the order of 0.080 by 0.030 inches, limited by the space available between leads and to allow for easy breaking off of flash at the termination of the molding process.

Figure 4:
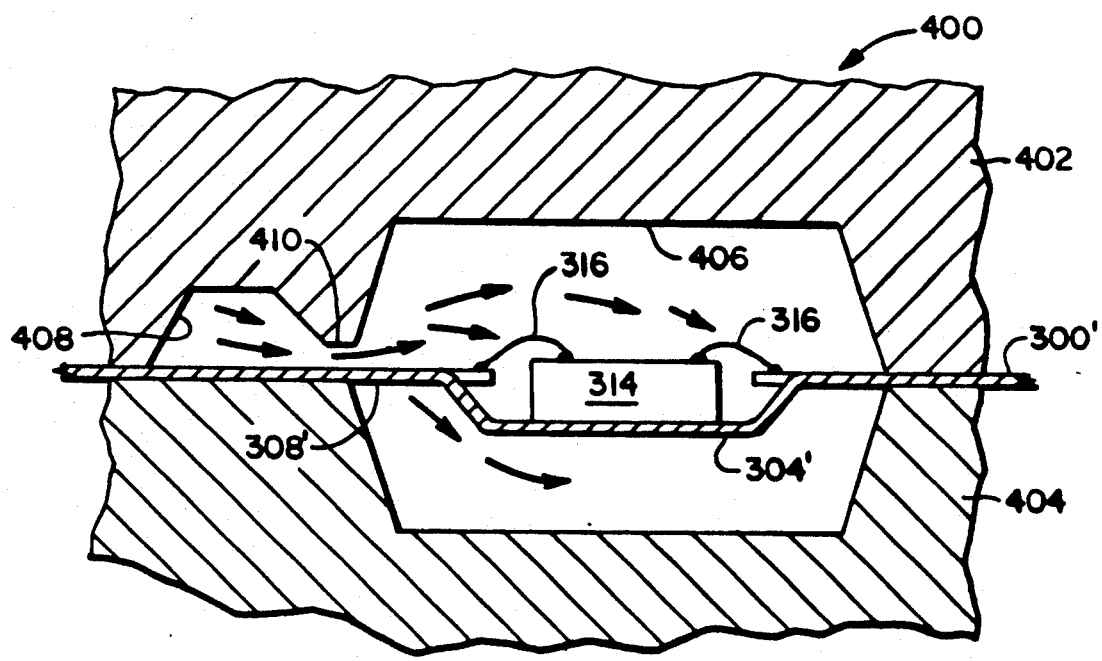
FIG. 4 is a cross-sectional view of a lead frame similar to that of FIG. 3, in a mold set. The inflow of molding compound is illustrated.

FIG. 4 illustrates the flow of molding compound, an a transfer molding process with a "standard" leadframe arrangement. In the example shown, the die attach pad (304; FIG. 3) is depressed below the plane of the lead frame. A mold set 400 comprises a top mold half 402 and a bottom mold half 404, together which form a cavity 406. A leadframe 300', similar to the leadframe 300 of FIG. 3, is supported between the mold halves 402 and 404, in a conventional manner. The top mold half 402 is provided with a runner 408, and a gate 410 at the interface of the runner 408 and the cavity 406.

A tiebar 308' supports the die paddle 304' in a manner similar to that shown in FIG. 3, and exits the cavity 406 at the gate 410.

The flow of molten molding compound is illustrated by arrows "→→→". As is evident, with the molding compound entering the cavity directly atop the lead frame, there is a direct path to the bond wires 316. As discussed hereinbefore, the pressurized "jet" of molding compound, entering directly atop the lead frame and inplane therewith, will cause wire wash. This effect is somewhat exacerbated when the die paddle is depressed (as shown).

In transferring the molding compound into the mold cavity, the pressure results in a "jet" of compound impinging directly onto the bond wires. This causes the wires to move, and can cause some of the wires to touch adjacent wires—resulting in shorts and reject devices. This problem is exacerbated when the mold gate is on the same side (top half) of the cavity as the die and wires.

Figure 5:
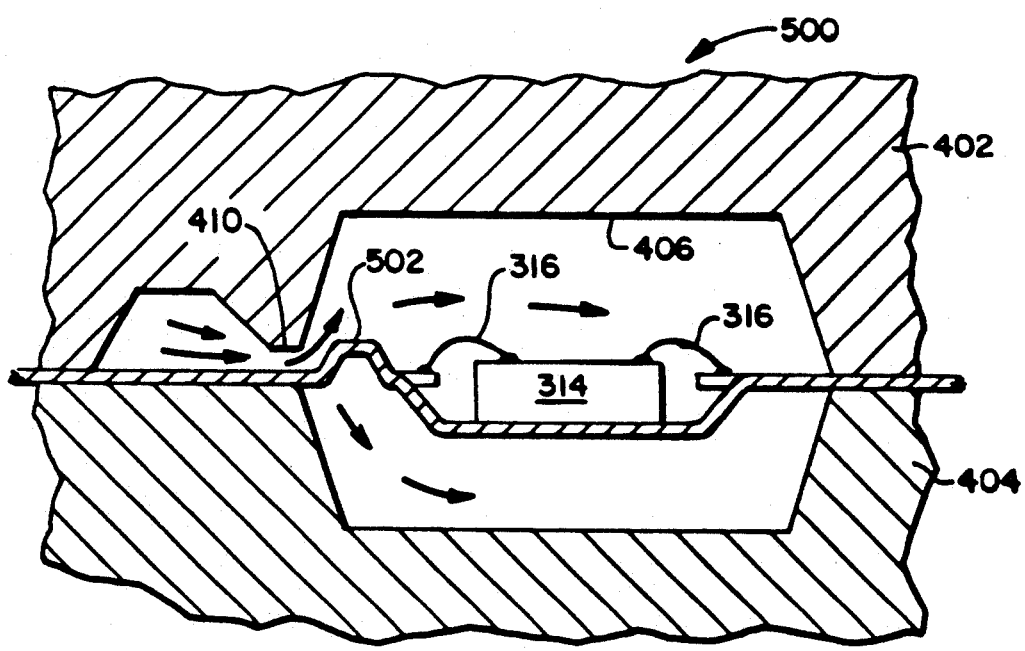
FIG. 5 is a cross-sectional view of a lead frame with a modified tie bar, according to the present invention, in a mold set. The inflow of molding compound is illustrated.

FIG. 5 illustrates an embodiment 500 of the present invention wherein the tiebar adjacent the gate is kinked to act as a baffle in the stream of incoming molding compound. The tiebar is designated "502". Remaining elements are similar to those shown in FIG. 4.

The tiebar 502 adjacent the gate 410 is modified by bending (kinking) so as to form a baffle within the cavity 406 directly in front of and closely adjacent to the gate 410. The tiebar is bent upward, out of the plane of the lead frame, approximately 0.050 inches, and is spaced inward from the gate (wall of the cavity) approximately 0.050 inches.

As illustrated, the modified tiebar 502 deflects the jet of molding compound "→→→" away from the bond wires 316, thereby alleviating the effect of wire wash.

The kinked portion of the tiebar, located just inside of the mold gate serves as a baffle in the path of the flow of molding compound, effectively slowing down the velocity of the molding compound during the transfer process. The wires are thus shielded from the high pressure jet of molding compound. The shaping of the tiebar is done with a depressing tool (die) during the manufacture of the leadframe, in a manner akin to that which is commonly used to depress the die paddle. The modified (kinked) section of tiebar also can be shaped such that the molding compound is forced to flow onto the lower (non-gated) section of the cavity. (In the example of FIGS. 4 and 5, the top mold half is gated.)

Figure 6:
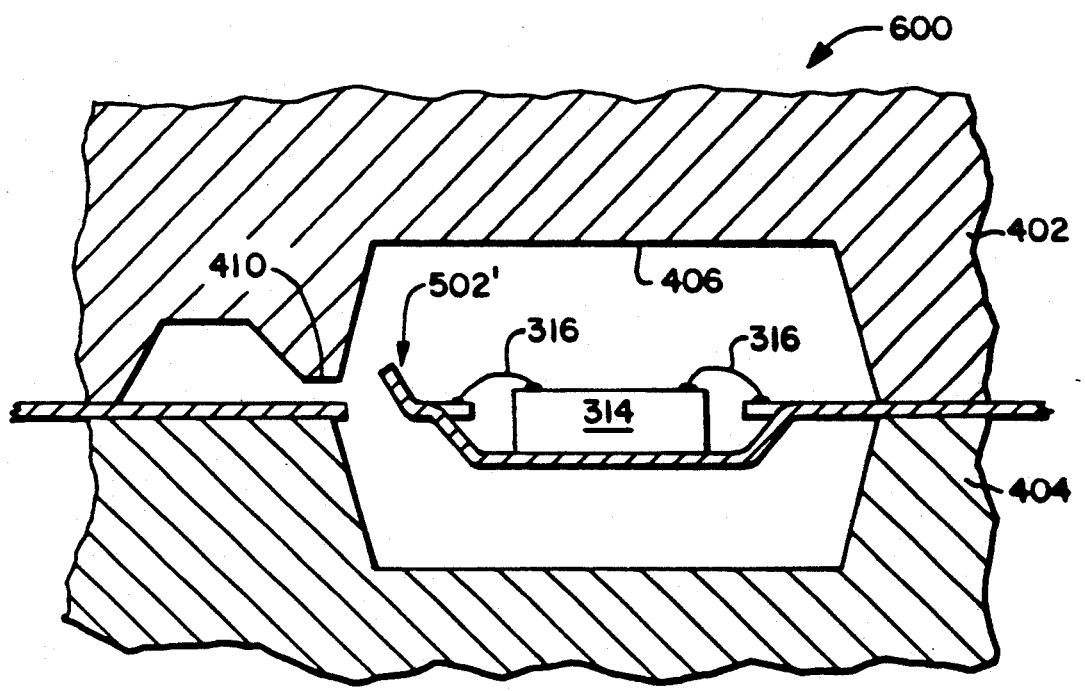
FIG. 6 is a cross-sectional view of a lead frame with modified tie bar, according to another embodiment of the present invention, in a mold set.

FIG. 6 illustrates an alternate embodiment 600 of the invention wherein the tiebar 502' adjacent the gate 410 is cut and bent to act as a baffle in the stream of incoming molding compound. In this example, the tiebar 502' is cut at a position corresponding to the wall of the cavity 406, and the remaining inboard portion of the tiebar 502' is bent upwards to form a baffle in front of the gate 410. This arrangement will deflect the jet of incoming molding compound as described with the embodiment of FIG. 5. The arrows "→→→" are omitted in this view, for clarity.

Figure 7:
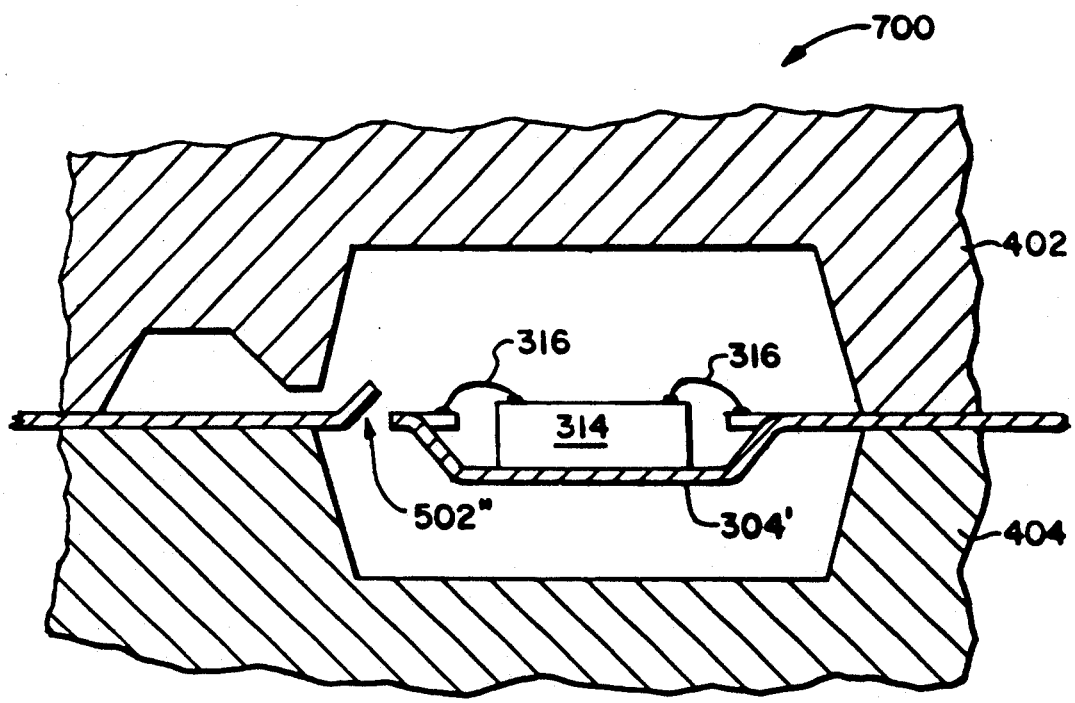
FIG. 7 is a cross-sectional view of a lead frame with modified tie bar, according to yet another embodiment of the present invention, in a mold set.

FIG. 7 illustrates yet another embodiment 700 of the invention wherein the tiebar 502" adjacent the gate 410 is cut and bent to act as a baffle in the stream of incoming molding compound. In this example, the tiebar 502" is cut closer to the die paddle 304', and is bent upward at a position corresponding to the wall of the cavity 406, thereby forming a baffle in front of the gate 410. This arrangement will deflect the jet of incoming molding compound as described with the embodiment of FIG. 5. The arrows "→→→" are omitted in this view, for clarity.

Alternative shapes for the tiebar modification, other than those specifically illustrated in FIGS. 5-7 are contemplated, so long as the modification produces an out-of-plane obstacle directly in front of the gate to prevent direct impingement of the jet of molding compound onto the bond wires.

FIG. 7 illustrates another embodiment of the invention, similar to that shown in FIG. 6, wherein the tiebar adjacent the gate is cur and bent the other way to act as a baffle in the stream of incoming molding compound.

What is claimed is:

1. Method of forming plastic IC packages, comprising:
   providing a mold set, including a top mold half having a top recess and a bottom mold half having a bottom recess, together the top and bottom recesses forming a cavity for molding a body about a substrate-mounted semiconductor die;
   providing a gate in at least one of the mold halves for transferring molding compound into the cavity;
   mounting a semiconductor device to a die paddle of a leadframe, said leadframe including a tiebar extending outward from the die paddle to an outer ring of the leadframe, said tiebar being initially in a plane of conductive leads extending from near the die paddle to the outer ring of the leadframe, said tiebar extending from a corner of the die paddle to a corner of the mold cavity;
   modifying a portion of the structure of the tiebar by kinking the tiebar in the direction of the gated mold half at a point within the cavity just interior of the gate to form a baffle integral with the tiebar, said baffle extending out of a the plane defined by the conductive leads;
   disposing said leadframe in the mold so that said baffle extends to within the mold gate in the direction of the gate;
   transferring molding compound through the gate into the cavity by injecting a stream of molding compound through the gate and
   deflecting the stream of molding compound with the baffle thereby preventing wire wash.

2. Method according to claim 3, wherein:
   the gate is disposed in the top mold half.

3. Method of forming plastic IC packages, comprising:
   providing a mold set, including a top mold half having a top recess and a bottom mold half having a bottom recess, together the top and bottom recesses forming a cavity for molding a body about a substrate-mounted semiconductor die;
   providing a gate in at least one of the mold halves for transferring molding compound into the cavity;
   mounting a semiconductor device to a die paddle of a leadframe, said leadframe including a tiebar extending outward from the die paddle to an outer ring of the leadframe, said tiebar being initially in a plane of conductive leads extending from near the die paddle to the outer ring of the leadframe, said tiebar extending from a corner of the die paddle to a corner of the mold cavity;
   modifying a portion of the structure of the tiebar by cutting the tiebar so as to have two free ends, and bending one of the free ends out of the plane in the direction of the gated mold half at a point within the cavity just interior of the gate to form a baffle integral with the tiebar, said baffle extending out of a the plane defined by the conductive leads;
   disposing said leadframe in the mold so that said baffle extends to within the mold gate in the direction of the gate;
   transferring molding compound through the gate into the cavity by injecting a stream of molding compound through the gate and
   deflecting the stream of molding compound with the baffle thereby preventing wire wash.

4. Method according to claim 3, wherein:
   the free end extending from the die paddle towards the gate is bent out of plane.

5. Method according to claim 3, wherein:
   the free end extending from the gate towards the die paddle is bent out of plane.

6. Method according to claim 3, wherein:
   the gate is disposed in the top mold half.

* * * * *

UNITED STATES PATENT AND TRADEMARK OFFICE
CERTIFICATE OF CORRECTION

PATENT NO. : 5,197,183
DATED : March 30, 1993
INVENTOR(S) : Chok J. Chia & Seng-Sooi Lim It is certified that error appears in the above-identified patent and that said Letters Patent is hereby corrected as shown below:

```
Col. 10, line 3, "2. Method according to claim 3, wherein:"
should read -- 2. Method according to claim 1, wherein: --
```

Signed and Sealed this

Fifth Day of April, 1994

Attest:

BRUCE LEHMAN

Attesting Officer  Commissioner of Patents and Trademarks